(12) United States Patent
Ge et al.

(10) Patent No.: US 7,026,546 B2
(45) Date of Patent: Apr. 11, 2006

(54) PRINTED CIRCUIT CARD KIT

(75) Inventors: Ming Ge, Kunsan (CN); Guohua Zhang, Kunsan (CN); ZiQiang Zhu, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/944,359

(22) Filed: Sep. 16, 2004

(65) Prior Publication Data

US 2005/0057984 A1    Mar. 17, 2005

(30) Foreign Application Priority Data

Sep. 17, 2003    (CN)    ............................... 03279388 U

(51) Int. Cl.
*H02G 3/08*    (2006.01)

(52) U.S. Cl. ...................... 174/52.1; 361/737

(58) Field of Classification Search ............... 174/52.1, 174/52.4; 361/683, 684, 736, 737, 816, 818, 361/728, 752, 740, 741, 747, 759; 235/492

See application file for complete search history.

(56) References Cited

U.S. PATENT DOCUMENTS

| | | | |
|---|---|---|---|
| 5,339,222 A | 8/1994 | Simmons et al. | |
| 5,574,628 A | 11/1996 | Persia et al. | |
| 5,923,026 A * | 7/1999 | Onoda | 235/492 |
| 6,058,018 A | 5/2000 | Gerrits et al. | |
| 6,320,252 B1 | 11/2001 | Potters et al. | |
| 6,341,729 B1 | 1/2002 | Lee | |
| 6,353,534 B1 * | 3/2002 | Chen | 361/684 |
| 6,381,144 B1 * | 4/2002 | Chiang | 361/737 |
| 6,546,621 B1 * | 4/2003 | Wang | 29/841 |

* cited by examiner

*Primary Examiner*—Hung V. Ngo
(74) *Attorney, Agent, or Firm*—Wei Te Chung

(57) ABSTRACT

A printed circuit card kit (1) comprises a frame (2), an end cover (6), a rectangular lower cover (3), a rectangular upper cover (4), and a pair of side covers (5). The upper cover and the lower cover comprise respectively a pair of edges defining a number of openings (420,320). The frame has two side rails (22) defining a number of recesses (230). The side covers have a number of projections (50) respectively aligned with the openings and recesses. Assembling the end cover to an end of the frame, assembling the upper and lower covers to the frame and assembling the pair of side covers to the side rails of the frame. Therefore, the projections pass the openings and to be retained in the recesses.

4 Claims, 5 Drawing Sheets

PRINTED CIRCUIT CARD KIT

BACKGROUND OF THE INVENTION

1. Field of the Invention

The present invention is related to a printed circuit card kit of a printed circuit card which is used in computers and other electronic equipments.

2. Description of Related Art

Printed Circuit (PC) cards are widely used in desktop computers, facsimile machines, notebook computers and other electronic equipments. Each of the PC cards generally comprises a printed circuit board (PCB), at least an electrical connector mounted to the PCB and a PC card kit enclosing the PCB and the electrical connector. With the development of the technology, the circuitry of the PCB of the PC card become more and more complex and is easily damaged in use. Further, the PC card is highly desired to provide reliable data in higher transferring speeds, so it is necessary to design a PC card kit that encloses and protects the PCB more reliably.

U.S. Pat. No. 6,320,252 discloses a PC card comprising a PCB, two connectors mounted on two ends of the PCB and a PC card kit surrounding the PCB and the connectors. The PC card kit comprises two card shields that are bonded together by ultrasonic welding, laser welding or adhesive. When the card is inserted into or removed from the electronic equipment, the card shields tend to become loose and/or separated from one another as the card is subjected to flexing or torsional stresses. Thus, even after moderate amounts of usage, conventional PC card kits have frequently become structurally loose, and the internal members of the card often become misaligned. This results in failure of the PC card and degrades the performance of the electronic equipment that uses the card. These undesirable results generally induce incontinuous shielding in the PC card. Furthermore, additional special equipment is required by either the ultrasonic welding process or the laser welding process, so the production cost of the card is also greatly high.

U.S. Pat. No. 5,339,222 discloses a PC card kit comprising a rectangular bottom cover member formed of a conductive material, insulative corner supports integrally molded to respective corners of the bottom cover member and a rectangular upper cover member having a downwardly extending flange. Each of the corner supports includes a lower flange portion adapted to receive the extending flange to contact with the lower cover member. Integrally molding the insulative corner supports with the bottom cover member results in poor performance of a combination therebetween. Further, the efficiency of manufacturing is decreased and the production cost is increased.

Hence, an improved PC card kit is highly desired to overcome the aforementioned disadvantages of the prior art.

SUMMARY OF THE INVENTION

Accordingly, an object of the present invention is to provide a PC card kit, which can provide continuous shielding and sufficient rigidity.

Another object of the present invention is to provide a PC card kit, which can improve production efficiency and decrease production cost.

In order to achieve the objects set forth, an improved PC card kit is provided. The card kit comprises a frame, an upper cover, a lower cover, a pair of side covers and an end cover. The frame comprises two side rails defining a plurality of recesses therein. The two side covers respectively comprise a plurality of projections retained in the corresponding recesses. The upper and the lower covers respectively define a plurality of openings corresponding to the projections. When assembling, the end cover is mounted to one end of the frame, and the upper and the lower covers are mounted to the top and the bottom of the frame. The two side covers are mounted to the side rails of the frame, the projections are retained in the recesses through the corresponding openings.

Other objects, advantages and novel features of the present invention will be drawn from the following detailed description of a preferred embodiment of the present invention with attached drawings, in which:

DETAILED DESCRIPTION OF THE INVENTION

Reference will now be made in detail to the preferred embodiment of the present invention.

Figure 1:
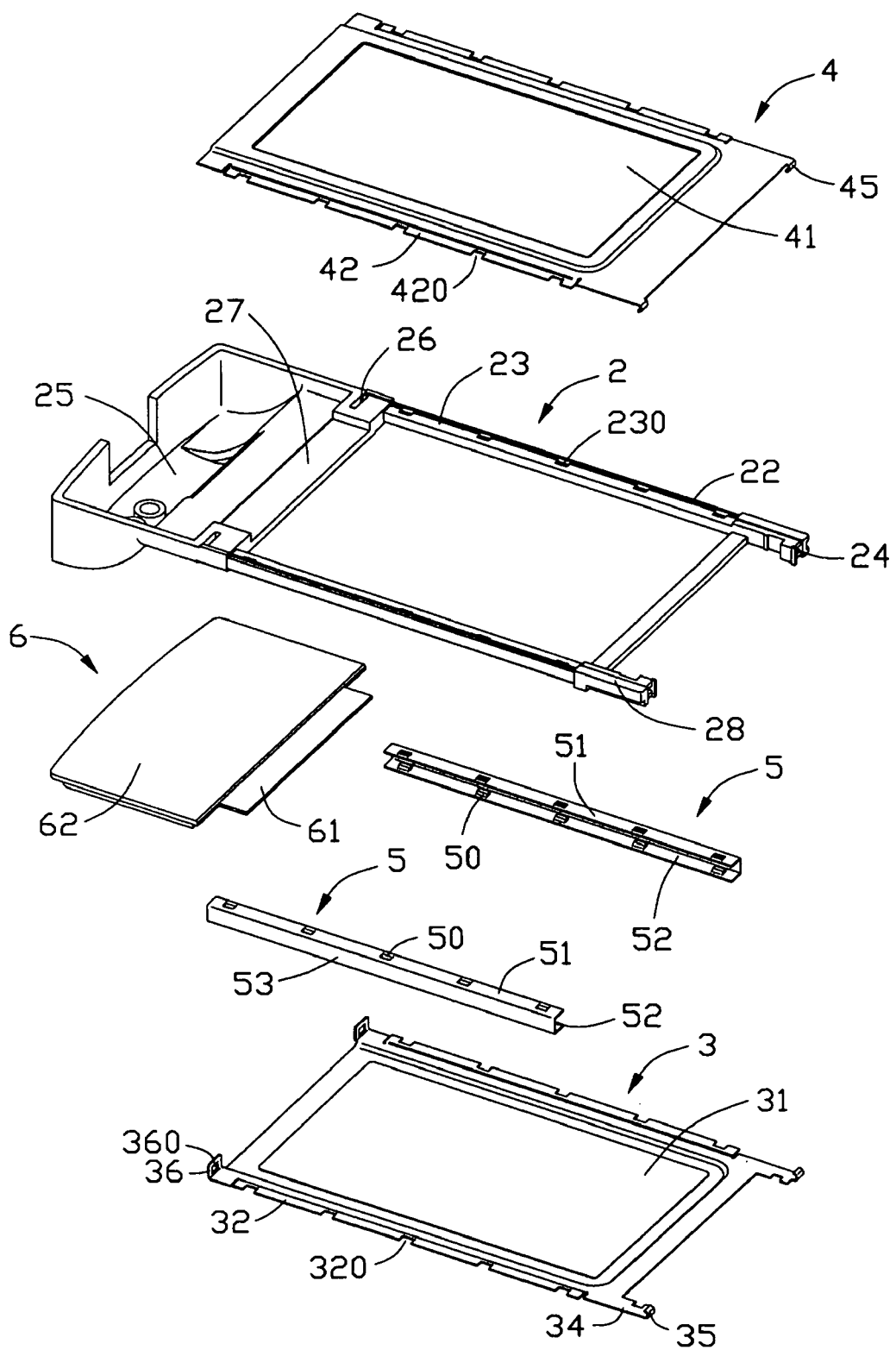
FIG. 1 is an exploded, perspective view of a PC card kit in accordance with the present invention.
Figure 4:
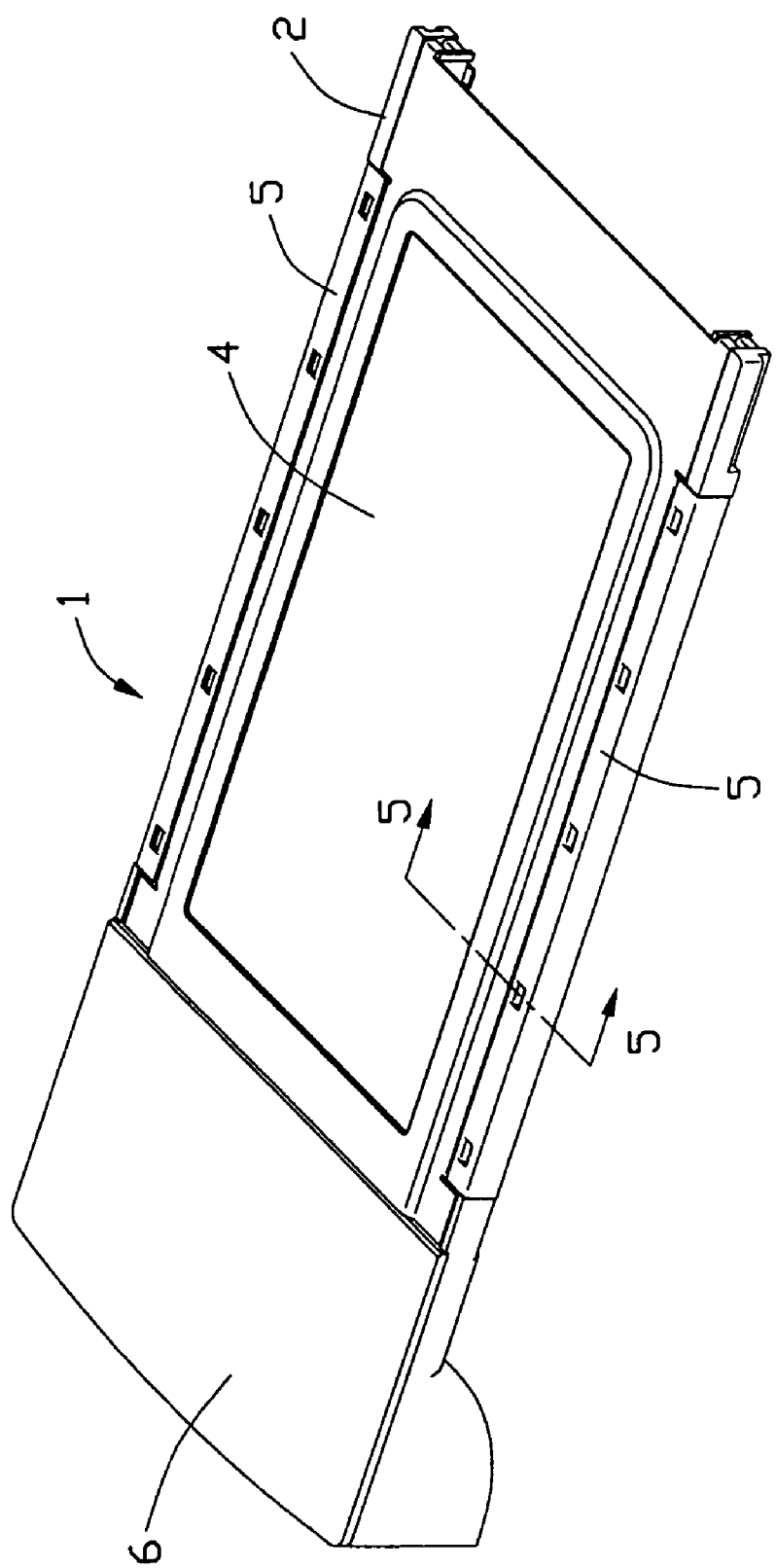
FIG. 4 is an assembled, perspective view of the PC card kit.

Referring to FIG. 1 and FIG. 4, a PC card kit 1 in accordance with the present invention comprises a frame 2, a lower cover 3, an upper cover 4, a pair of side covers 5 and an end cover 6.

Figure 2:
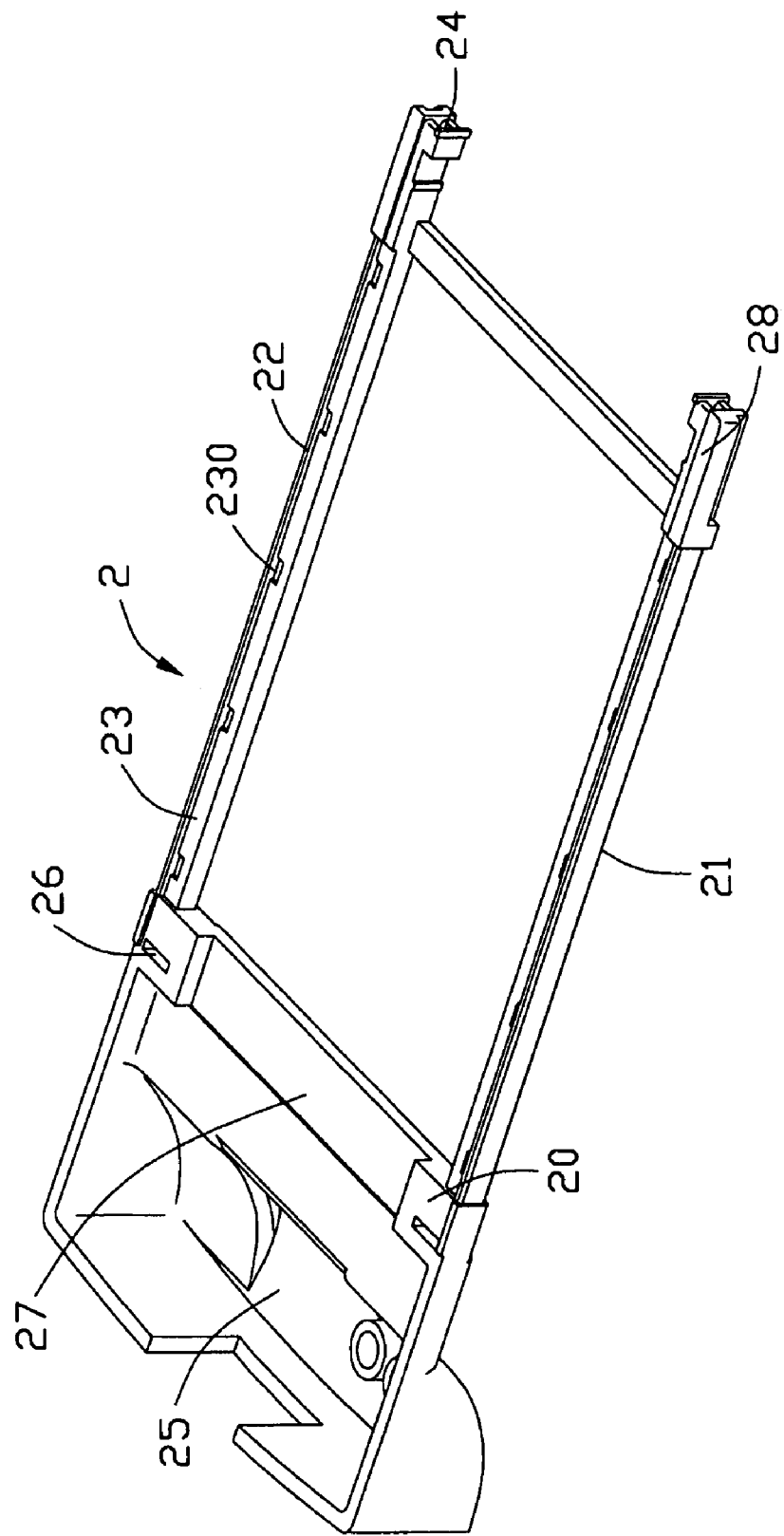
FIG. 2 is a perspective view of a frame of the PC card kit in accordance with the present invention.
Figure 3:
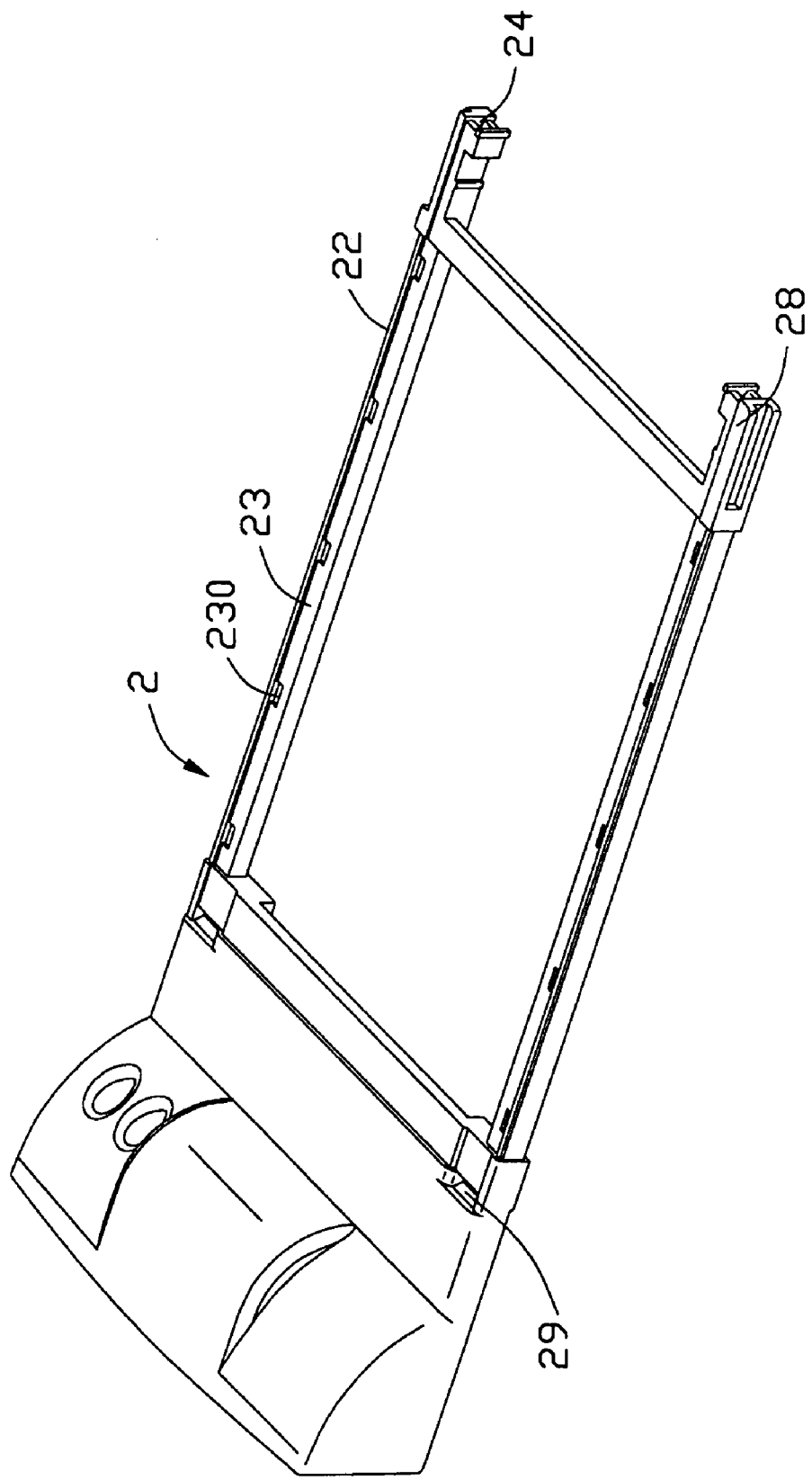
FIG. 3 is a perspective view of the frame of the PC card kit, taken from another angle.

Referring to FIGS. 1 and 2 in conjunction with FIG. 3, the frame 2 comprises two longitudinal side rails 22, a receiving space 25 for receiving an electrical connector (not show) connected with a printed circuit board (not shown) and a flange 20 between the two side rails 22 and the receiving space 25. The two longitudinal side rails 22 respectively include a top and a bottom surfaces 23, 21 and a plurality of recesses 230 defined in the top and bottom surfaces 23, 21. The receiving space 25 is defined in one end of frame 2. The flange 20 comprises a groove 27, two symmetrical guide slots 26 and a protrusion 29 in each of the guide slots 26. Two arms 28 extend longitudinally out of the side rails 22 on the other end of the frame 2 for receiving another electrical connector therebetween. Each of the arms 28 defines an inward cutout 24 at an end thereof.

Referring to FIG. 1 in conjunction with FIG. 4, the lower cover 3 and the upper cover 4 are made up of metal material. A rectangular flat plate 31 is located in the center of the lower cover 3 and a rectangular flat plate 41 is located in the center of the upper cover 4, so it is convenient to receive a printed circuit board (not shown) in a space between the plates 31, 41. The lower and the upper covers 3, 4 each comprise two edges 32, 42 defining a plurality of openings 320, 420 which correspond to the recesses 230 of the frame 2 and open away from the edges 32, 42. The lower cover 3 is formed with two fingers 34 at one end thereof. Each of the fingers 34 is formed with a curved latch section 35 retained in the cutout 24 of the frame 2. The lower cover 3 comprises two tabs 36 opposite to the fingers 34 and perpendicular to the rectangular flat plate 31. The tabs 36 respectively define an aperture 360 therein for mating with the protrusion 29. The upper cover 4 comprises two latches 45 extending into the cutouts 24 to contact with the latch sections 35.

The side covers 5 respectively comprise an upper wall 51, a lower wall 52 and a side wall 53 between the upper wall 51 and the lower wall 52. The upper and the lower walls 51, 52 have a plurality of projections 50. The projections 50 of the upper wall 51 extend downwardly and the projections 50 of the lower wall 52 extend upwardly. The end cover 6 comprises a base portion 62. An extension 61 extends from one end of the base portion 62 and is parallel with the base portion 62.

Figure 5:
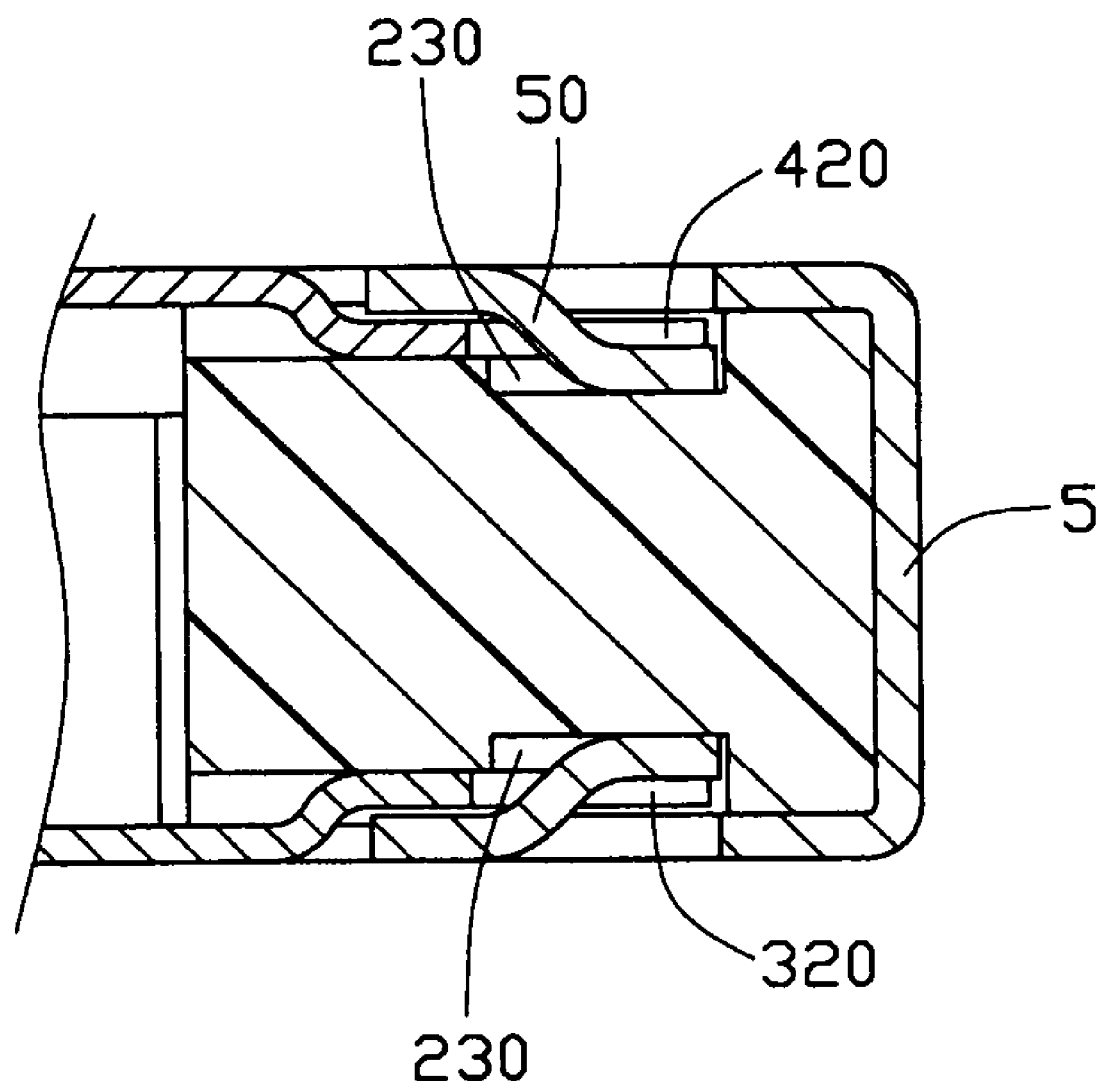
FIG. 5 is a cross-sectional view of the assembled PC card kit, taken along line 5—5 of FIG. 4.

Referring to FIG. 4 and FIG. 5 in conjunction with FIG. 1 and FIG. 2, when assembling, the base portion 62 of the end cover 6 covers the receiving space 25 and the extension 61 of the end cover 6 extends into the groove 27. The upper and the lower covers 4, 3 are respectively mounted onto the top and bottom of the frame 2. The upper cover 4 contacts with the end cover 6. The latch sections 35 and the latches 45 are entirely retained in the cutouts 24 and contact each other fully. The tabs 36 extend into the guide slots 26, and the protrusions 29 mate with the apertures 360 of the tabs 36. The openings 320, 420 are aligned with the recesses 230. The side covers 5 are mounted on the frame 2, and the edges 32, 42 of the lower and upper covers 3, 4 extend into the side covers 5 to contact the lower and the upper covers 3, 4 with the side covers 5. The projections 50 extend into the recesses 230 of the frame 2 by way of the openings 320, 420 to be retained in the recesses 230. The flange 20 and the arms 28 are both higher than the two side rails 22 so that they can prevent the side covers 5 from moving along a longitudinal direction of the side rails 22. At this time, continuous shielding is established. In assembling the PC card kit 1 without any other equipment or other materials such as glue, ultrasonic, it is easy to produce the members of the PC card kit 1. For all of the above-mentioned reason, it is possible that the members of the PC card kit 1 are manufactured on a large scale, so the production efficiency is improved and the cost of the product is decreased.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit card kit, comprising:
    a frame comprising two side rails;
    an upper cover and a lower cover respectively mounted on the frame, the upper cover and the lower cover respectively comprising a pair of edges defining a plurality of openings,
    a pair of side covers with a U-shaped cross-sectional configuration being mounted to the side rails, respectively, in an inward lateral direction, and each of said side covers comprising a plurality of projections vertically extends into the corresponding openings, respectively;
    wherein said each side rail comprises a top surface and a bottom surface each of which defines a plurality of recesses in vertical alignment with corresponding openings, respectively, and said projections vertically passing through the openings to be retained in the recesses; and
    wherein each side cover comprises an upper wall, a lower wall and a side wall, the projections being respectively formed in the upper and the lower walls.

2. The printed circuit card kit as claimed in claim 1, further comprising an end cover assembled on one end of the frame to electrically connect with the upper cover.

3. A printed circuit card kit, comprising:
    a frame comprising two side rails;
    an upper cover and a lower cover respectively mounted on the frame, the upper cover and the lower cover each comprising a pair of edges defining a plurality of openings;
    a pair of side covers respectively mounted to the side rails in an inward lateral direction, and each side cover comprising an upper wall and a lower wall each of which defines a plurality of projections corresponding to the openings; and
    wherein said edges of the upper cover and the lower cover and said rail being sandwiched between said upper wall and said lower wall.

4. The printed circuit card kit as claimed in claim 3, wherein the side rail further defines a plurality of recesses in alignment with corresponding openings, respectively, said projections passing through the openings to be retained in the recesses.

* * * * *